(12) United States Patent
Sasaki et al.

(10) Patent No.: US 8,502,332 B2
(45) Date of Patent: Aug. 6, 2013

(54) MAGNETIC SENSOR AND MAGNETIC HEAD (75) Inventors: Tomoyuki Sasaki, Tokyo (JP); Tohru Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 198 days.

(21) Appl. No.: 13/227,135

(22) Filed: Sep. 7, 2011

(65) Prior Publication Data

US 2012/0074510 A1    Mar. 29, 2012

(30) Foreign Application Priority Data

Sep. 24, 2010 (JP) ................... P2010-213913

(51) Int. Cl.
*H01L 29/82* (2006.01)
(52) U.S. Cl.
USPC .................. 257/422; 257/E29.323
(58) Field of Classification Search
USPC .......................... 257/422, E29.323
See application file for complete search history.

(56) References Cited

U.S. PATENT DOCUMENTS

| | | | |
|---|---|---|---|
| 7,956,395 B2 * | 6/2011 | Inokuchi et al. | 257/295 |
| 7,969,692 B2 | 6/2011 | Takahashi | |
| 2011/0204886 A1 | 8/2011 | Sasaki et al. | |

FOREIGN PATENT DOCUMENTS

| | | |
|---|---|---|
| JP | A-2007-299467 | 11/2007 |
| JP | A-2010-037362 | 2/2010 |
| JP | A-2011-176012 | 9/2011 |

OTHER PUBLICATIONS

Sasaki et al.; "Evidence of Electrical Spin Injection Into Silicon Using MgO Tunnel Barrier;" *IEEE Transactions on Magnetics* vol. 46 No. 6; Jun. 2010; pp. 1436-1439.
Sasaki et al.; "Temperature Dependence of Spin Diffusion Length in Silicon by Hanle-type Spin Precession;" *Applied Physics Letters*; vol. 96; Mar. 22, 2010; pp. 122101-1-122101-3.
Suzuki et al., "Room-Temperature Electron Spin Transport in a Highly Doped Si Channel," *Applied Physics Express*, vol. 4, Feb. 7, 2011, pp. 023003-1 through 023003-3.
U.S. Appl. No. 13/396,062, filed Feb. 14, 2012 in the name of Tomoyuki Sasaki et al.

* cited by examiner

*Primary Examiner* — Calvin Lee
*Assistant Examiner* — Monica D Harrison
(74) *Attorney, Agent, or Firm* — Oliff & Berridge, PLC (57) ABSTRACT

A magnetic sensor 1 comprises a main channel layer 7a having first, second, and third regions 71, 72, 73 and extending in a first direction; a first ferromagnetic layer 12A mounted on the first region 71; a second ferromagnetic layer 12B mounted on the second region 72; a projection channel layer 7b projecting in a direction perpendicular to a thickness direction of the main channel layer 7a from a side face of the third region 73 between the first and second regions 71, 72 in the main channel layer 7a; and a magnetic shield S covering both sides in the thickness direction of the projection channel layer 7b and both sides in the first direction of the projection channel layer 7b and exposing an end face 7c in the projecting direction of the projection channel layer 7b.

17 Claims, 9 Drawing Sheets

MAGNETIC SENSOR AND MAGNETIC HEAD

BACKGROUND OF THE INVENTION

1. Field of the Invention

The present invention relates to a magnetic sensor and a magnetic head.

2. Related Background Art

Various devices for detecting external magnetic fields have conventionally been known (see, for example, the following Patent Literature 1). Magnetic heads and magnetic sensors used in HDD and the like, for example, have been desired to detect magnetic fields from minute areas and exhibit high output characteristics. Conventional TMR devices have a spin-valve structure and exhibit relatively high output characteristics. The devices have been made finer in order to detect magnetic fields from minute areas. However, making the devices finer increases their resistance. For example, a limit begins to appear in areas with a recording density of 1 Tbit/inch or higher, thereby necessitating other structures and systems.

Patent Literature 1: Japanese Patent Application Laid-Open No. 2007-299467.

SUMMARY OF THE INVENTION

Figure 8:
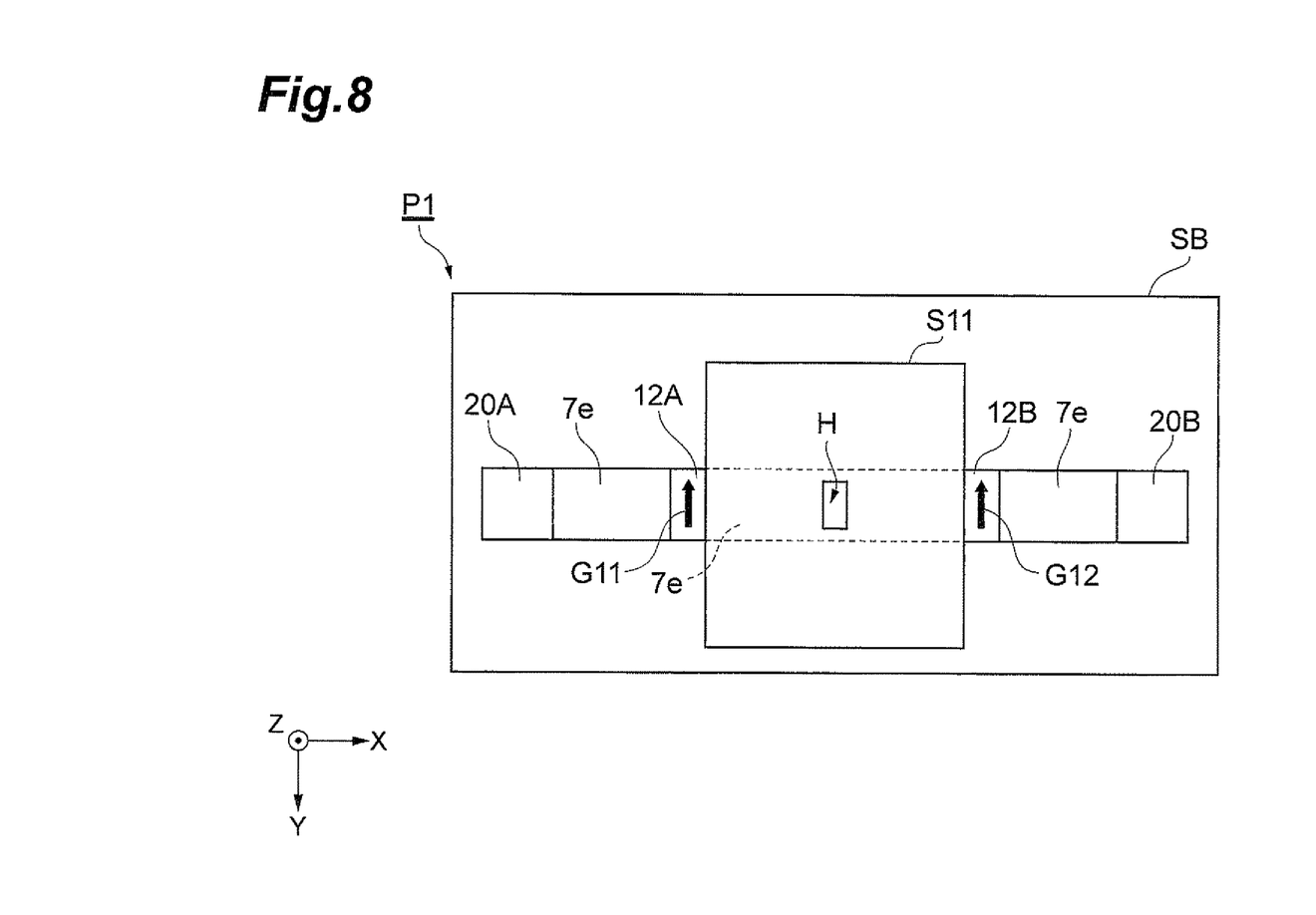
FIG. 8 is a top plan view illustrating an example of magnetic sensors.

Therefore, a structure of a magnetic sensor P1 illustrated in FIG. 8, for example, is considered. In the magnetic sensor P1, a channel 7e is mounted on a substrate SB, and a first ferromagnetic layer 12A, a second ferromagnetic layer 12B, a first reference electrode 20A, and a second reference electrode 20B are mounted on the channel 7e. In the channel 7e, the portion between the first and second ferromagnetic layers 12A, 12B is covered with a magnetic shield layer S11. The magnetic shield layer S11 is formed with a through hole H extending to the channel 7e. In this structure, letting the first and second ferromagnetic layers 12A, 12B have respective directions of magnetization G11, G12 both oriented along the Y axis, an external magnetic field may be applied to the channel 7e along the Z axis through the through hole H. The direction of spins transported through the channel 7e rotates about the axis of the applied magnetic field, and the spins diffuse while thus rotating (so-called Hanle effect). In such a structure of the magnetic sensor P1, the resolution in detecting external magnetic fields is determined by the size of the through hole H provided in the magnetic shield layer S11. Hence, magnetic fluxes can be detected from a minute area corresponding to the size of the through hole H. Here, since the magnetic fluxes can be detected without reducing the size of the first and second ferromagnetic layers 12A, 12B, the device resistance can be inhibited from being increased by making the first and second ferromagnetic layers 12A, 12B finer.

In the structure illustrated in FIG. 8, however, the axial direction of the through hole H where the external magnetic field enters coincides with the direction of mounting the channel 7e with respect to the substrate SB. That is, when thus constructed magnetic sensor P1 is employed for a reading head unit of a magnetic head, its mounting process is performed parallel to the ABS (Air Bearing Surface). On the other hand, a recording head unit for writing in the magnetic head is typically made by a mounting process performed perpendicular to the ABS. This makes it difficult for the reading head unit and the recording head unit to be made continuously with each other, which is unsuitable for mass production.

Figure 9:
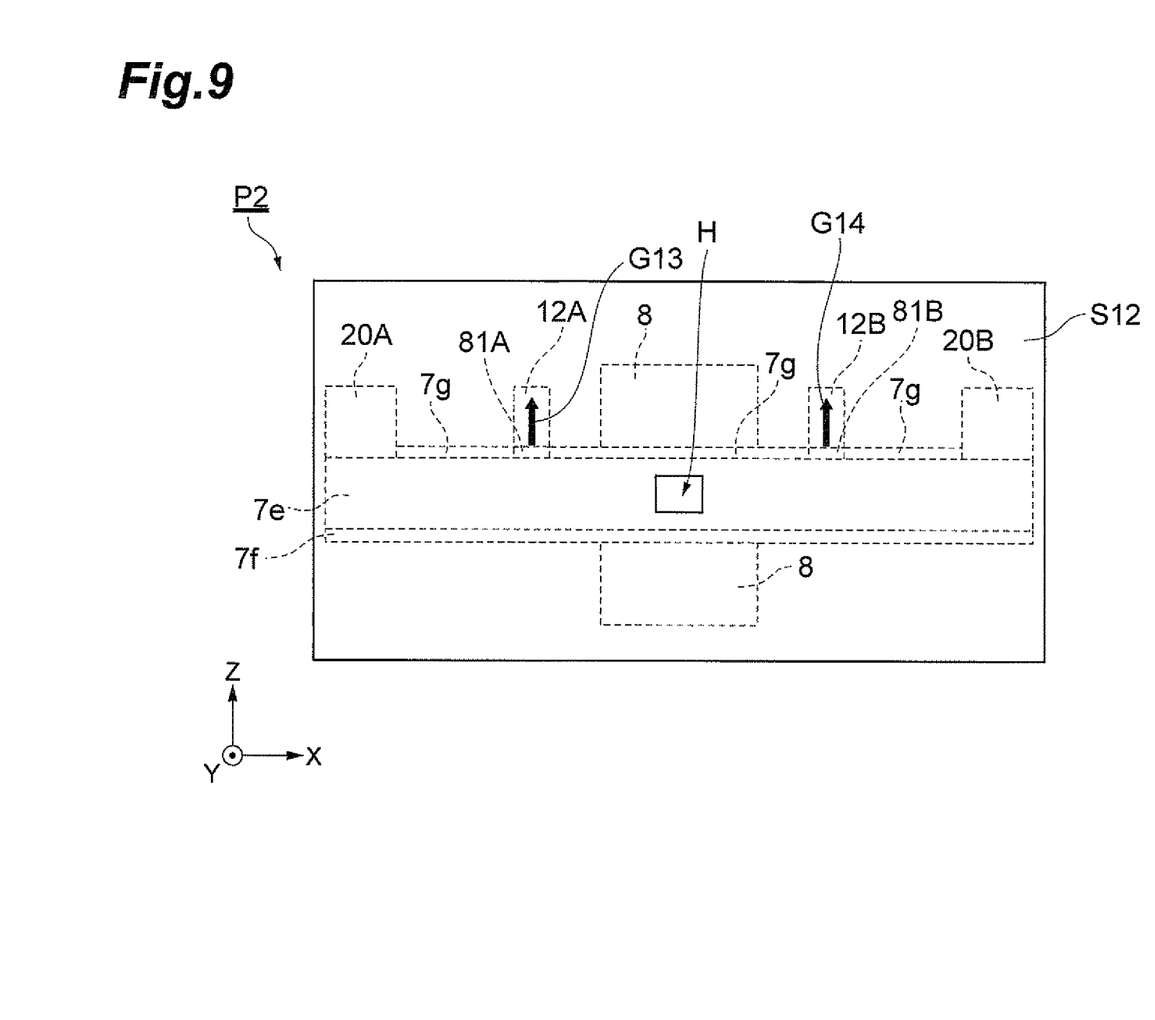
FIG. 9 is a side view illustrating an example of magnetic sensors.

As in a magnetic sensor P2 illustrated in FIG. 9, a structure in which the through hole H is formed in a magnetic shield layer S12 covering a side part of the channel 7e may be considered. In this structure, letting the first and second ferromagnetic layers 12A, 12B have respective directions of magnetization G13, G14 both oriented along the Z axis, an external magnetic field may be applied to the channel 7e along the Y axis through the through hole H. The through hole H is arranged such as to oppose a side face of the channel 7e located between the first and second ferromagnetic layers 12A, 12B. This arrangement allows external magnetic fields from minute areas to be read from the side face of the channel 7e through the through hole H. In FIG. 9, 81A, 81B, 7f, and 7g indicate insulating films, while 8 denotes a permanent magnet.

When manufacturing the magnetic sensor P2 having the structure illustrated in FIG. 9, however, the substrate is cut and processed after a mounting process for forming the channel 7e, first ferromagnetic layer 12A, second ferromagnetic layer 12B, and the like on the substrate. After the processing, it is necessary to mount the magnetic shield layer S12 on the side part of the channel 7e and form the minute through hole H by photoprocessing. Such a manufacturing technique is unsuitable for mass production.

Further, in the structure of the magnetic sensor P1 illustrated in FIG. 8, the through hole H is positioned and opened after forming the magnetic shield layer S11 covering the channel 7e, whereby the width (length along the Y axis in FIG. 8) of the through hole H must be made smaller than the width (length along the Y axis in FIG. 8) of the channel 7e through which spins are transported. Therefore, the external magnetic field applied through the through hole H can reach only a part of the width of the channel 7e through which the spins flow, whereby output is hard to improve. Similarly, in the structure of the magnetic sensor P2 illustrated in FIG. 9, the through hole H is positioned and opened after forming the magnetic shield layer S12 covering the channel 7e, whereby the thickness (length along the Z axis in FIG. 9) of the through hole H must be made smaller than the thickness (length along the Z axis in FIG. 9) of the channel 7e through which the spins are transported. Therefore, the external magnetic field applied through the through hole H can reach only a part of the thickness of the channel 7e through which the spins flow, whereby output is hard to improve.

The magnetic sensor and magnetic head in accordance with one aspect of the present invention are suitable for mass production and improve output in a structure which can detect magnetic fluxes from minute areas.

The magnetic sensor in accordance with one aspect of the present invention comprises a main channel layer having first, second, and third regions and extending in a first direction; a first ferromagnetic layer mounted on the first region; a second ferromagnetic layer mounted on the second region; a projection channel layer projecting in a direction perpendicular to a thickness direction of the main channel layer from a side face of the third region between the first and second regions in the main channel layer; and a magnetic shield covering both sides in the thickness direction of the projection channel layer and both sides in the first direction of the projection channel layer and exposing an end face in the projecting direction of the projection channel layer.

In the magnetic sensor in accordance with one aspect of the present invention, a channel has the main channel layer and projection channel layer, while the magnetic shield surrounds the projection channel layer about its projecting direction so as to expose the end face of the projection channel layer. Therefore, magnetic fields from the outside can selectively be supplied from the exposed end face to the channel. The direction of spins transported through the channel rotates about the axis of an applied magnetic field, and the spins diffuse while thus rotating (so-called Hanle effect). When no external magnetic field is applied to the channel, the spins within the channel diffuse as they are without changing their direction. Hence, when a voltage output or resistance output with respect to the external magnetic field is read at the first or second ferromagnetic layer functioning as a reception electrode, a value corresponding to the degree of rotation of spins occurring depending on whether there is an external magnetic field or not can be detected. As a consequence, a magnetic flux from a minute area corresponding to the size of the exposed end face of the channel can be detected.

In the magnetic sensor in accordance with one aspect of the present invention, as mentioned above, the magnetic shield surrounds the projection channel layer about its projecting direction so as to expose the end face of the projection channel layer. Such a structure can easily be made with high mass productivity by preparing a part of the magnetic shield beforehand and forming thereon a channel including the main channel layer and projection channel layer and thereafter another part of the magnetic shield on side and upper parts of the projection channel layer. The layers can be mounted perpendicular to the ABS and thus are favorable when employing the magnetic sensor in a magnetic head, for example, because of their high compatibility to a method of manufacturing a recording head unit which is formed by mounting layers perpendicular to the ABS.

The magnetic sensor in accordance with one aspect of the present invention requires no process of opening a through hole for supplying magnetic fields in the magnetic shield, whereby the end face of the projection channel layer can easily attain the same thickness as that of the main channel layer. As a consequence, a region where an external magnetic field applied from the end face of the projection channel layer enters can have a thickness on a par with that of the main channel layer through which the spins flow, whereby output can also be raised.

Preferably, the first and second ferromagnetic layers have a direction of magnetization perpendicular to the projecting direction of the projection channel layer. When an external magnetic field is applied, the direction of spins within the channel rotates about the axis of the applied magnetic field as mentioned above. If the direction of magnetization of the first and second ferromagnetic layers is parallel to the projecting direction of the projection channel layer, no rotation will occur in the direction of spins upon external magnetic field application regardless of from which ferromagnetic layer the spins are injected, whereby magnetic fluxes will be hard to detect. Such magnetic fluxes can favorably be detected when the first and second ferromagnetic layers have a direction of magnetization perpendicular to the projecting direction of the projection channel layer.

Preferably, the first and second ferromagnetic layers have the same direction of magnetization. This makes it easy to pin the magnetization of the first and second ferromagnetic layers.

Preferably, the first and second ferromagnetic layers have a direction of magnetization identical to a direction of mounting the first and second ferromagnetic layers with respect to the main channel layer. In this case, the direction of magnetization of spins injected from the ferromagnetic layers and transported through the channel is rotated by the external magnetic field applied from the end face of the projection channel layer. Hence, the above-mentioned magnetic fluxes can favorably be detected.

Preferably, the first and second ferromagnetic layers have a direction of magnetization in the first direction. The direction of magnetization of spins injected from the end face of the ferromagnetic layers and transported through the channel is rotated by the external magnetic field applied from the end face of the projection channel layer in this case as well. Hence, the above-mentioned magnetic fluxes can favorably be detected.

Preferably, the end face in the projecting direction of the projection channel has one of rectangular, triangular, trapezoidal, and circular forms. Each of these forms allows external magnetic fields to be detected favorably.

Preferably, a side face of the main channel layer on a side opposite from the projection channel layer is depressed. Such a form allows a spin flow in the main channel layer to pass favorably therethrough to the projection channel layer, i.e., to the end face in the projecting direction. This can raise the sensitivity of the magnetic sensor for external magnetic fields and further improve its output characteristics.

Preferably, the direction of magnetization of the first and second ferromagnetic layers is pinned by antiferromagnetic layers arranged on the first and second ferromagnetic layers, respectively. When the antiferromagnetic layers are exchange-coupled with the first and second ferromagnetic layers, unidirectional anisotropy can be imparted to the direction of magnetization of the first and second ferromagnetic layers. This yields the first and second ferromagnetic layers having a higher coercive force in one direction than when no antiferromagnetic layers are provided.

Preferably, between the first and second ferromagnetic layers, surfaces of the main and projection channel layers are covered with an insulating layer. This can prevent spin flows from flowing out from the main and projection channel layers to the magnetic shield, whereby the output caused by the external magnetic field can be measured accurately.

Preferably, between the first and second ferromagnetic layers, the main and projection channel layers are electrically insulated from the magnetic shield. This can restrain electric currents and spin flows from flowing out from the main and projection channel layers to the magnetic shield.

Preferably, the magnetic sensor further comprises a permanent magnet for supplying a magnetic field to the main channel layer through the end face of the projection channel layer. In the case where no magnetic field is applied to the channel by using the permanent magnet, an output peak appears when the external magnetic field to be detected is zero. Applying a magnetic field to the channel by using the permanent magnet can shift the output peak position, so as to generate an output peak when the external magnetic field is not zero.

Preferably, the first and second ferromagnetic layers are made of a metal selected from the group consisting of Cr, Mn, Co, Fe, and Ni; an alloy containing at least one element selected from the group; or a compound containing at least one element selected from the group and at least one element selected from the group consisting of B, C, N, Si, and Ge. These materials are ferromagnetic materials having high spin polarizability and thus can favorably achieve functions as spin injection electrodes or spin reception electrodes.

Preferably, the main and projection channel layers are made of a semiconductor containing at least one of Si, Ge, GaAs, C, and ZnO. Such a semiconductor has a relatively long spin diffusion length and thus allows the channel to store spins favorably therewithin.

Preferably, a barrier is formed between at least one of the first and second ferromagnetic layers and the main channel layer. This makes it possible to inject a large number of spin-polarized electrons from at least one of the first and second ferromagnetic layers to the main channel layer, so as to enhance the potential output of the magnetic sensor. Preferably, as such a barrier, a tunnel barrier made of an insulating film is employed. It is also preferred for the barrier to be a Schottky barrier.

The magnetic head in accordance with one aspect of the present invention comprises a reading head unit constituted by the above-mentioned magnetic sensor and a recording head unit for writing. This can provide a novel magnetic head utilizing the so-called Hanle effect.

The magnetic sensor and magnetic head in accordance with one aspect of the present invention are suitable for mass production and improve output in a structure which can detect magnetic fluxes from minute areas.

DESCRIPTION OF THE PREFERRED EMBODIMENTS

In the following, preferred embodiments of the magnetic sensor will be explained in detail with reference to the drawings. An XYZ orthogonal coordinate system is illustrated in most of the drawings.

Figure 1:
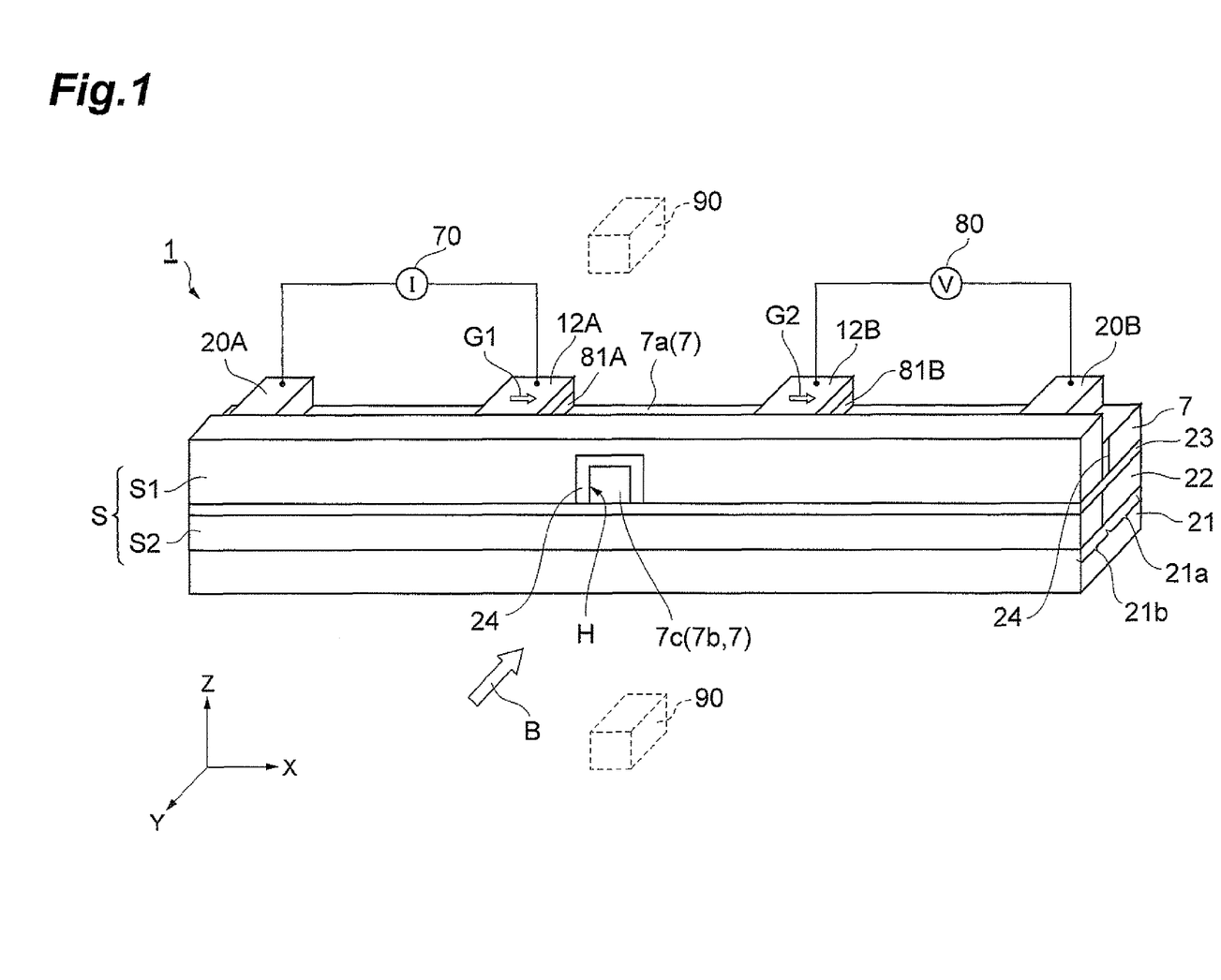
FIG. 1 is a schematic perspective view of a magnetic sensor in an embodiment of the present invention.

FIG. 1 is a schematic perspective view of a magnetic sensor 1 in an embodiment of the present invention. The magnetic sensor 1 mainly comprises a substrate 21, a channel 7, a first ferromagnetic layer 12A, a second ferromagnetic layer 12B, and a magnetic shield S and detects an external magnetic field B in the −Y direction. The substrate 21 is an AlTiC substrate, for example. The substrate 21 has a first part 21a and a second part 21b. The first and second parts 21a, 21b extend in a predetermined axial direction (X direction in this example) within the substrate 21 and are arranged parallel to each other.

The channel 7 includes a main channel layer 7a extending in the X direction (first direction) and a projection channel layer 7b projecting in the Y direction. As illustrated in FIG. 1, the main channel layer 7a and projection channel layer 7b are arranged above the first and second parts 21a, 21b of the substrate 21, respectively.

Figure 2:
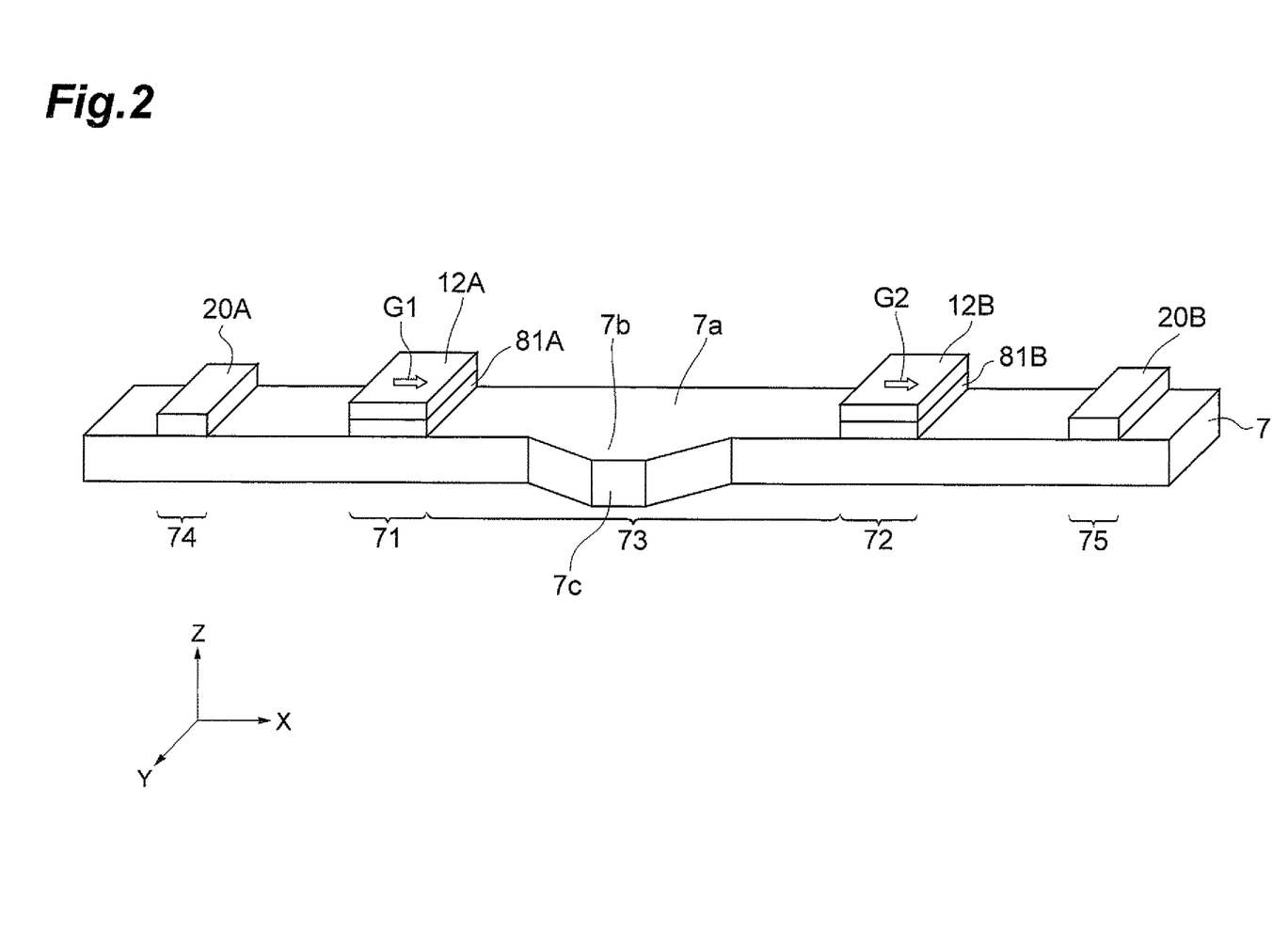
FIG. 2 is a schematic perspective view illustrating the form of a channel.

FIG. 2 is a schematic perspective view illustrating the form of the channel 7. The main channel layer 7a has a rectangular form when seen in the thickness direction of the channel (Z direction). The main channel layer 7a has a first region 71, a second region 72, a third region 73, a fourth region 74, and a fifth region 75. Here, the fourth region 74 is arranged on the outer side of the first region 71, while the fifth region 75 is arranged on the outer side of the second region 72.

The projection channel layer 7b projects in a direction (Y direction) perpendicular to the thickness direction (Z direction) of the main channel layer 7a from a side face of the third region 73 between the first and second regions 71, 72 in the main channel layer 7a. More specifically, the projection channel layer 7b extends in a direction (Y direction) which is perpendicular to both of the first direction (X direction) and the mounting direction (Z direction) of the first and second ferromagnetic layers 12A, 12B with respect to the channel 7.

The channel 7 may be doped with ions for imparting electric conductivity thereto. The ion concentration may be $1.0 \times 10^{15}$ to $1.0 \times 10^{22}$ cm$^{-3}$, for example. Preferably, the channel 7 is made of a material exhibiting a long spin life, an example of which is a semiconductor containing one of Si, Ge, GaAs, C, and ZnO. Preferably, the distance from the first ferromagnetic layer 12A to the second ferromagnetic layer 12B in the channel 7 is not longer than the spin diffusion length of the channel 7.

The first and second ferromagnetic layers 12A, 12B function as an injection electrode for injecting spins into the channel 7 or a reception electrode for detecting the spins transported through the channel 7. The first ferromagnetic layer 12A is mounted on the first region 71 of the channel 7. The second ferromagnetic layer 12B is mounted on the second region 72 of the channel 7. Each of the first and second ferromagnetic layers 12A, 12B has a rectangular parallelepiped form whose longer axis lies in the Y direction. The first and second ferromagnetic layers 12A, 12B may have the same width in the X direction.

For example, as illustrated in FIGS. 1 and 2, the direction of magnetization G1 of the first ferromagnetic layer 12A may be identical to the direction of magnetization G2 of the second ferromagnetic layer 12B. This makes it easy to pin the magnetization of the first and second ferromagnetic layers 12A, 12B. The first and second ferromagnetic layers 12A, 12B are made of a ferromagnetic material. For example, the first and second ferromagnetic layers 12A, 12B may be made of a metal selected from the group consisting of Cr, Mn, Co, Fe, and Ni; an alloy containing at least one element selected from the group; or a compound containing at least one element selected from the group and at least one element selected from the group consisting of B, C, N, Si, and Ge.

The magnetic shield S blocks external magnetic fields from entering the channel 7, first ferromagnetic layer 12A, and second ferromagnetic layer 12B. The magnetic shield S covers both sides in the thickness direction (Z direction) of the projection channel layer 7b and both sides in the first direction (X direction) of the projection channel layer 7b through an insulating layer, while exposing an end face 7c in the projecting direction of the projection channel layer 7b. Thus constructed magnetic shield S is constituted by a first magnetic shield layer S1 and a second magnetic shield layer S2. The first magnetic shield layer S1 is arranged above the second part 21b of the substrate 21. The second magnetic shield layer S2 is also arranged above the second part 21b of the substrate 21. Examples of materials for the magnetic shield S (first and second magnetic shield layers S1, S2) include soft magnetic materials such as alloys containing Ni and Fe, sendust, alloys containing Fe and Co, and alloys containing Fe, Co, and Ni. The thickness (length in the Z direction) of the first magnetic shield layer S1, which is 0.02 µm to 1 µm, for example, is greater than the thickness (length in the Z direction) of the main channel layer 7a and projection channel layer 7b. The thickness (length in the Z direction) of the second magnetic shield layer S2 is 0.02 µm to 1 µm, for example.

The magnetic shield S has a through hole H for exposing the end face 7c in the projecting direction (Y direction) of the projection channel layer 7b. The through hole H is used for applying the external magnetic field B to the main channel layer 7a through the projection channel layer 7b. The external magnetic field B enters from the end face 7c of the channel layer 7b exposed at the through hole H.

Figures 3A, 3C:
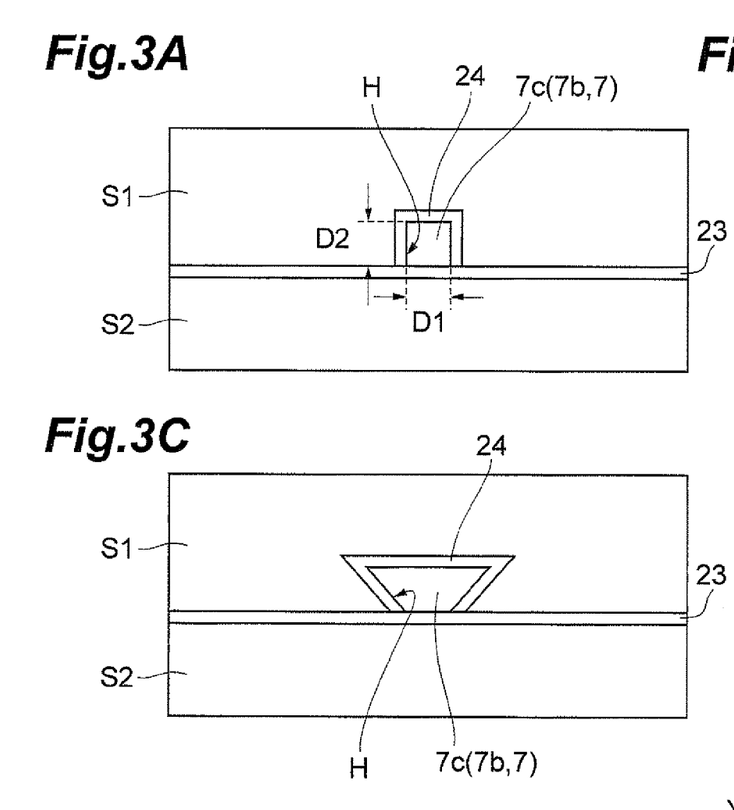
FIG. 3A is a side view illustrating forms of a through hole and an end face in the projecting direction of a projection channel layer.
FIG. 3C is a side view illustrating a modified example of the forms of the through hole and an end face in the projecting direction of the projection channel layer.

FIG. 3A is a side view illustrating an example of forms of the through hole H and the end face 7c in the projecting direction of the projection channel layer 7b. The end face 7c exposed at the through hole H is a flat surface having a rectangular form. The through hole H has a form corresponding to that of the end face 7c, which is rectangular in this example, while being able to take various forms when seen in the axial direction (−Y direction). The through hole H may have one side with a length (X-direction length) D1 of 0.01 µm to 0.1 µm and the other side with a length (Z-direction length) D2 of 0.001 µm to 0.1 µm. The length (Z-direction length) D2 of the other side of the through hole H is identical to the thickness of the main channel layer 7a and projection channel layer 7b.

The magnetic sensor 1 further comprises a first reference electrode 20A and a second reference electrode 20B. The first reference electrode 20A is mounted on the fourth region 74 of the channel 7. The second reference electrode 20B is mounted on the fifth region 75 of the channel 7. On the channel 7, the first reference electrode 20A, first ferromagnetic layer 12A, second ferromagnetic layer 12B, and second reference electrode 20B are arranged in this order at predetermined intervals in the X direction. The first and second reference electrodes 20A, 20B are made of an electrically conductive material such as Al, for example.

Preferably, the magnetic sensor 1 further comprises a barrier. The barrier is disposed between the main channel layer 7a and at least one of the first and second ferromagnetic layers 12A, 12B. This makes it possible to inject a large number of spin-polarized electrons from at least one of the first and second ferromagnetic layers 12A, 12B to the main channel layer 7a, so as to enhance the potential output of the magnetic sensor. In the example illustrated in FIGS. 1 and 2, the barrier is a tunnel barrier constituted by insulating films 81A, 81B. The insulating film 81A is disposed between the first region 71 of the main channel layer 7a and the first ferromagnetic layer 12A. The insulating film 81B is disposed between the second region 72 of the main channel layer 7a and the second ferromagnetic layer 12B. While this example illustrates a case where each of the insulating films 81A, 81B is constituted by a single layer, each may have a multilayer structure constituted by a plurality of layers. For example, layers of magnesium oxide, aluminum oxide, titanium oxide, and zinc oxide can be used for the insulating films 81A, 81B. Preferably, each of the insulating films 81A, 81B has a thickness of 3 nm or less from the viewpoints of inhibiting resistance from increasing and allowing them to function as tunnel insulating layers. Preferably, in view of single atomic layer thickness, the thickness of each of the insulating films 81A, 81B is 0.4 nm or greater.

The magnetic sensor 1 further comprises a lower insulating layer 22 and an intermediate insulating layer 23. The lower insulating layer 22 and intermediate insulating layer 23 function as a foundation for the channel 7. The lower insulating layer 22 is disposed on the first part 21a of the substrate 21. The intermediate insulating layer 23 is disposed on the lower insulating layer 22 and second magnetic shield layer S2. That is, the intermediate insulating layer 23 is disposed above the first and second parts 21a, 21b of the substrate 21. Hence, the main channel layer 7a is mounted on the intermediate layer 23 above the first part 21a of the substrate 21. On the other hand, the projection channel layer 7b is mounted on the intermediate layer 23 above the second part 21b of the substrate 21.

The lower insulating layer 22 and intermediate insulating layer 23 are made of an insulating material, an example of which is a film of an oxide such as alumina. The thickness (length in the Z direction) of the lower insulating layer 22 is 0.02 µm to 1 µm, for example. The thickness (length in the Z direction) of the intermediate insulating layer 23 is 0.003 µm to 0.03 µm, for example. When thus made relatively thick, the lower insulating layer 22 and intermediate insulating layer 23 serving as a foundation for the channel 7 can inhibit spin flows and electric currents from leaking from the channel 7.

The magnetic sensor 1 further comprises a channel-magnetic-shield insulating layer 24. The channel-magnetic-shield insulating layer 24 is disposed between the channel 7 (the main channel layer 7a and projection channel layer 7b) and the first magnetic shield layer S1. The intermediate insulating layer 23 disposed on the lower face of the projection channel layer 7b and the channel-magnetic-shield insulating layer 24 provided on the upper and side faces of the projection channel layer 7b and one side face on the Y direction side of the main channel layer 7a insulate the channel 7 from the first and second magnetic shield layers S1, S2. The channel-magnetic-shield insulating layer 24 is made of an insulating material, an example of which is a film of an oxide such as $SiO_2$.

An example of methods for manufacturing the magnetic sensor 1 in accordance with this embodiment will now be explained. First, the substrate 21 prepared beforehand is formed with an alignment mark. With reference to the alignment mark, a magnetic shield film to become the second magnetic shield layer S2 is formed on the substrate 21. Subsequently, a resist mask is formed by photolithography, and a surplus of the magnetic shield film is removed by milling or RIE. This forms the second magnetic shield layer S2 on the second part 21b of the substrate 21.

Next, an insulating film to become the lower insulating layer 22 is formed on the whole surface of the substrate 21 and then polished by CMP until the second magnetic shield layer S2 is exposed. This forms the lower insulating layer 22 on the first part 21a of the substrate 21. Subsequently, an insulating layer to become the intermediate insulating layer 23 is formed by MBE on the whole surface of the substrate 21, i.e., on the first and second parts 21a, 21b. The insulating layer to become the intermediate insulating layer 23 is made of a material such as $HfO_2$, $SiO_2$, $Al_2O_3$, MgO, or SiC, for example, and has a thickness of 3 to 30 nm, for example.

Thereafter, a semiconductor layer to become the channel 7 is formed by MBE on the insulating layer to become the intermediate insulating layer 23. An example of the semiconductor layer is an Si layer having a thickness of 50 nm. The semiconductor layer is crystallized by laser annealing.

After the crystallization, the surface of the semiconductor layer is washed by the RCA method and then with hydrofluoric acid. Subsequently, 1 nm of an MgO layer, 5 nm of an Fe layer as the first and second ferromagnetic layers 12A, 12B, and 3 nm of a Ti layer as a protective film, for example, are formed by MBE as a barrier on the semiconductor layer. Thereafter, ion milling is used so as to remove the protective film and a part of the Fe layer to become the first and second ferromagnetic layers 12A, 12B, thereby leaving the Fe layer with a thickness of 3 nm, for example.

Further, a synthetic composite film in which CoFe, Ru, CoFe, IrMn, Ru, and Ta are layered in this order, for example, is formed by sputtering on the Fe layer to become the first and second ferromagnetic layers 12A, 12B. This structure allows an antiferromagnetic layer to pin the Fe layer.

Subsequently, annealing is performed under a magnetic field, so as to improve the combinability between the Fe layer to become the first and second ferromagnetic layers 12A, 12B and the CoFe layer and cause the antiferromagnetic layer to pin the direction of magnetization of the first and second ferromagnetic layers 12A, 12B.

After the annealing, a resist mask is formed by photolithography, and the device as a whole is processed by etching and ion milling. Here, the semiconductor layer is processed, so as to form the channel 7 including the main channel layer 7a and projection channel layer 7b as illustrated in FIG. 2.

Thereafter, an insulating layer is formed by a thickness of 50 nm, for example, on the exposed side faces of the channel 7. Then, a mask for processing the Fe layer to become the first and second ferromagnetic layers 12A, 12B and the synthetic composite film into rectangular forms, for example, is formed by EB or photolithography. Using this mask, unnecessary parts of the barrier layer and ferromagnetic layer on the channel 7 and a part of the channel 7 are removed by ion milling. This forms the first ferromagnetic layer 12A on the insulating layer 81A on the first region 71 of the channel 7 and the second ferromagnetic layer 12B on the insulating layer 81B on the second region 72 of the channel 7.

Further, an insulating layer is formed by a thickness of 20 nm, for example, on the exposed surface of the channel 7, side faces of the insulating films 81A, 81B, and side faces of the first and second ferromagnetic layers 12A, 12B. Subsequently, while covering the upper side of the first part 21a of the substrate 21 with a resist mask, the first magnetic shield layer S1 is formed above the second part 21b of the substrate 21 by photolithography. As a consequence, the projection channel layer 7b is covered with the first magnetic shield layer S1 through the insulating layer (channel-magnetic-shield insulating layer 24). The first magnetic shield layer S1 is formed on the intermediate insulating layer 23 on the second magnetic shield layer S2. Thus, the magnetic shield S covers both sides in the thickness direction (Z direction) of the projection channel layer 7b and both sides in the first direction (X direction) of the projection channel layer 7b through the insulating layers, while exposing the end face 7c in the projecting direction of the projection channel layer 7b.

Thereafter, photolithography is used, so as to form the first reference electrode 20A in the fourth region 74 on the outer side of the first region 71 in the channel 7, and the second reference electrode 20B in the fourth region 74 on the outer side of the second region 72. Here, Al electrodes are formed as the first and second reference electrodes 20A, 20B by ion milling and sputtering.

Further, a plurality of electrode pads are formed on the substrate 21 and used for wiring the first ferromagnetic layer 12A and the first reference electrode 20A to each other and the second ferromagnetic layer 12B and the second reference electrode 20B to each other. The foregoing method produces the magnetic sensor 1 illustrated in FIGS. 1 and 2.

Operations and effects of the magnetic sensor 1 in accordance with this embodiment will now be explained. Before bringing the magnetic sensor 1 into action, the directions of magnetization of the first and second ferromagnetic layers 12A, 12B are pinned. In the example illustrated in FIGS. 1 and 2, the direction of magnetization G1 of the first ferromagnetic layer 12A is pinned to the first direction (X direction) as with the direction of magnetization G2 of the second ferromagnetic layer 12B.

In the magnetic sensor 1, the channel 7 has the main channel layer 7a and projection channel layer 7b, while the magnetic shield S surrounds the projection channel layer 7b about its projecting direction such as to expose the end face 7c of the projection channel layer 7b. Therefore, the magnetic field B from the outside can selectively be supplied from the exposed end face 7c to the channel 7.

As illustrated in FIG. 1, the first ferromagnetic layer 12A and first reference electrode 20A are connected to an electric current source 70, for example, so as to cause a detection electric current to flow through the first ferromagnetic layer 12A. As the electric current flows from the first ferromagnetic layer 12A, which is a ferromagnet, to the nonmagnetic main channel layer 7a through the insulating film 81A, electrons having spins in a direction corresponding to the direction of magnetization G1 of the first ferromagnetic layer 12A are injected into the channel 7. The injected spins diffuse toward the second ferromagnetic layer 12B. Thus, a structure in which the electric current and spin flow running through the channel 7 are mainly oriented in the first direction (X direction) can be obtained.

Here, when the external magnetic field B is not applied to the channel 7, i.e., when the external magnetic field B is zero, the direction of spins diffusing through the third region 73 between the first and second regions 71, 72 of the channel 7 does not rotate. Therefore, the spins having the same direction as with the preset direction of magnetization G2 of the second ferromagnetic layer 12B diffuse to the second region 72. Hence, the resistance output or voltage output takes a local extreme value when the external magnetic field B is zero. It may be a local maximum or minimum value depending on the direction of electric current or magnetization. The output can be evaluated by an output meter such as a voltmeter 80 connected to the second ferromagnetic layer 12B and second reference electrode 20B, for example.

A case where the external magnetic field B is applied to the channel 7 will now be considered. The external magnetic field B is applied to the channel 7 from the end face 7c of the projection channel layer 7b exposed at the through hole H. In the example of FIG. 1, the external magnetic field B is applied in a direction (−Y direction) perpendicular to the direction of magnetization G1 (X direction) of the first ferromagnetic layer 12A and the direction of magnetization G2 (X direction) of the second ferromagnetic layer 12B. When the external magnetic field B is applied, the direction of spins diffused through the region corresponding to the through hole H within the channel 7 rotates about the axial direction (−Y direction) of the external magnetic field B (so-called Hanle effect). The relative angle between the direction of rotation of the spins diffused to the second region 72 of the channel 7 and the preset direction of magnetization G2 of the second ferromagnetic layer 12B, i.e., the spins, determines the voltage output and resistance output at the interface between the channel 7 and the second ferromagnetic layer 12B. When the external magnetic field B is applied, the direction of spins diffused through the channel 7 rotates and thus does not align with the direction of magnetization G2 of the second ferromagnetic layer 12B. Hence, the resistance output or voltage output becomes a local maximum value or less when the external magnetic field B is applied in the case where it takes the local maximum value when the external magnetic field B is zero, while it becomes a local minimum value or greater when the external magnetic field B is applied in the case where it takes the local minimum value when the external magnetic field B is zero.

Therefore, in the magnetic sensor 1, the output exhibits a peak when the external magnetic field B is zero, and decreases as the external magnetic field B is enhanced or reduced. That is, the output varies depending on whether there is the external magnetic field B or not, whereby the magnetic sensor 1 in accordance with this embodiment can be used as a magnetic detecting device. While conventional magnetic sensors utilizing spins yield output peaks at relative angles where a free magnetization layer and a magnetization pinned layer have respective directions of magnetization parallel or antiparallel to each other, the magnetic sensor 1 in accordance with this embodiment exhibits an output peak when the external magnetic field B is zero as mentioned above. Therefore, when reading a positive/negative timing of the external magnetic field by employing the magnetic sensor 1 in accordance with this embodiment for a magnetic head, for example, an output peak appears at zero point magnetic field where magnetic fields of a magnetic domain wall cancel each other out, which can be determined as a point of inversion. The magnetic sensor 1 has no hysteresis.

Thus using the end face 7c of the projection channel layer 7b exposed from the magnetic shield S makes it possible to detect a minute magnetic flux corresponding to the size of the end face 7c. Here, since the resolution in detecting the external magnetic field is determined by the size of the end face 7c, the magnetic flux can be detected from a minute area without making the size (e.g., area of the XY plane) of the first and second ferromagnetic layers 12A, 12B very small. This can also inhibit the device resistance from being raised by making the first and second ferromagnetic layers 12A, 12B very small.

In the magnetic sensor 1, as mentioned above, the magnetic shield S surrounds the projection channel layer 7b about its projecting direction (Y direction) so as to expose the end face 7c of the projection channel layer 7b. Such a structure can easily be formed with high mass productivity by forming a part (the second magnetic shield layer S2) of the magnetic shield S on the substrate 21 beforehand, the channel 7 including the main channel layer 7a and projection channel layer 7b thereon, and another part (the first magnetic shield layer S1) of the magnetic shield S on the side and upper parts of the projection channel layer 7b thereafter. The layers can be mounted perpendicular to the ABS and thus are favorable when employing the magnetic sensor 1 in a magnetic head, for example, because of their high compatibility to a method of manufacturing a recording head unit which is formed by mounting layers perpendicular to the ABS.

Unlike the magnetic sensors P1, P2 illustrated in FIGS. 8 and 9, respectively, the magnetic sensor 1 in accordance with this embodiment requires no process of opening a through hole for supplying magnetic fields in the magnetic shield by alignment. This makes it easy for the end face 7c of the projection channel layer 7b to attain the same thickness (length in the Z direction) as that of the main channel layer 7a. As a consequence, a region where the external magnetic field B applied from the end face 7c of the projection channel layer 7b enters can have a thickness (length in the Z direction) on a par with that of the main channel layer 7a through which the spins flow, whereby output can also be raised.

Figure 3B:
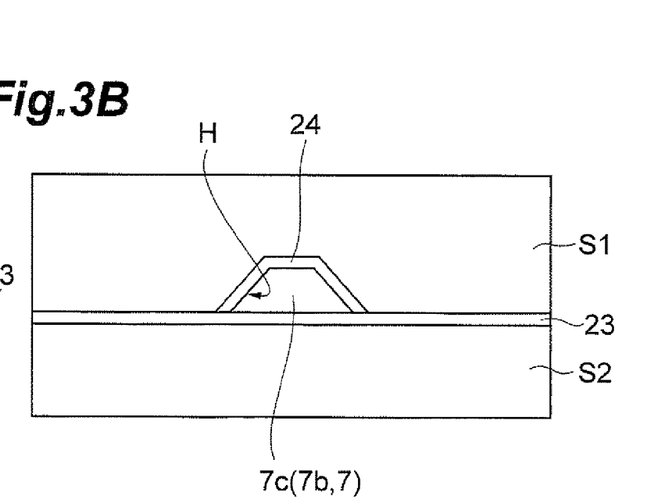
FIG. 3B is a side view illustrating a modified example of the forms of the through hole and an end face in the projecting direction of the projection channel layer.

While a preferred embodiment has been explained in detail in the foregoing, the present invention is not limited to the above-mentioned embodiment. The end face 7c in the projecting direction of the projection channel layer 7b is not limited to the above-mentioned rectangular form, but may be any of triangular, trapezoidal, and circular forms, for example. The external magnetic field B can favorably be detected in each of the above-mentioned forms. In the example illustrated in FIG. 3B, the end face 7c is shaped into a trapezoid whose upper base is shorter than its lower base. In the example illustrated in FIG. 3C, the end face 7c is shaped into a trapezoid whose upper base is longer than its lower base.

Figure 4A:
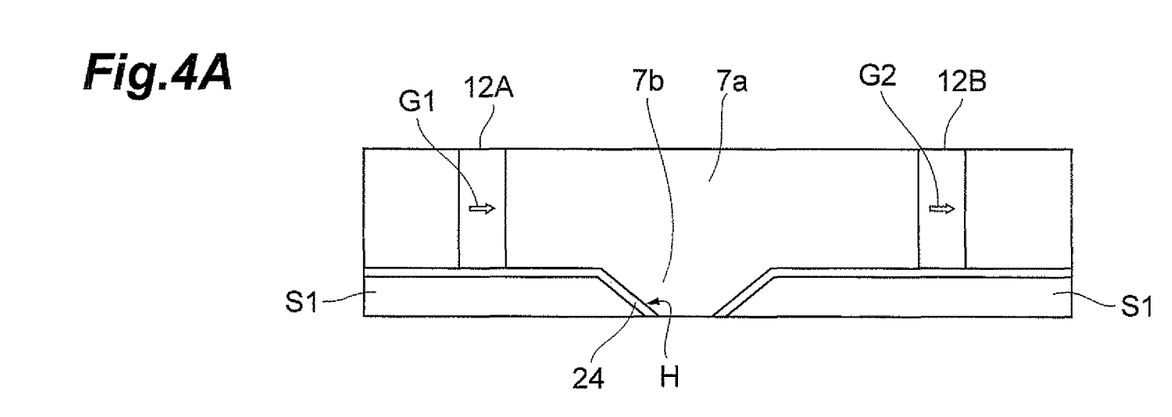
FIG. 4A is a top plan view illustrating the form of the channel.
Figure 4B:
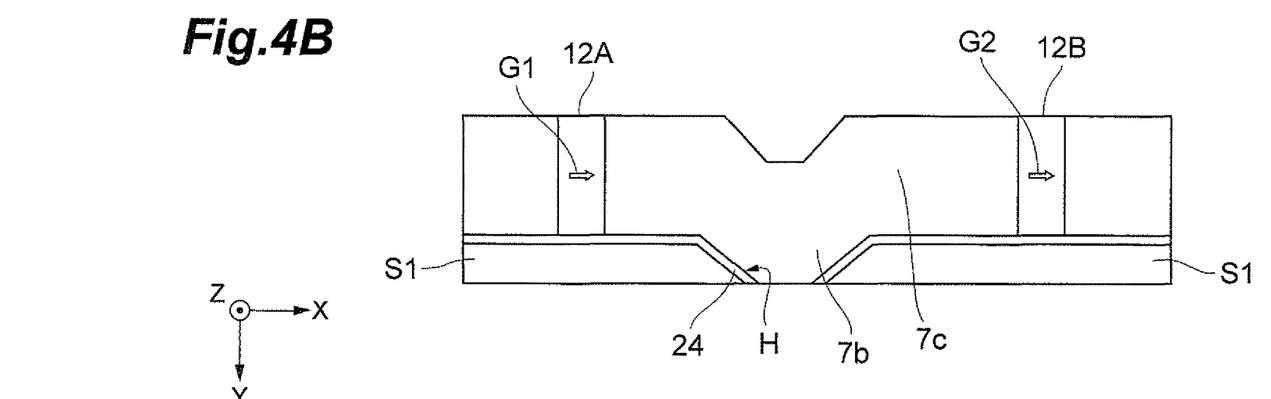
FIG. 4B is a top plan view illustrating a modified example of the form of the channel.

The above-mentioned embodiment represents a case where the main channel layer 7a of the channel 7 is rectangular when seen in the thickness direction as illustrated in FIG. 4A. Preferably, however, the side face of the main channel layer 7a on the side opposite from the projection channel layer 7b is depressed as illustrated in FIG. 4B. That is, the channel 7 in the third region 73 has such a form as to meander in the projection channel layer 7b. Such a form allows the spin flow in the channel 7 to pass favorably therethrough to the projection channel layer 7b, i.e., to the through hole H. This can raise the sensitivity of the magnetic sensor 1 for the external magnetic field B and further improve its output characteristics.

In the examples of FIGS. 4A and 4B, the projection channel layer 7b has a trapezoidal form including tilted parts when seen in the thickness direction (Z direction) of the channel 7. That is, in the examples of FIGS. 4A and 4B, the projection channel layer 7b is shaped like a mountain whose width (length in the X direction) is greater on the main channel layer 7a side than that on the leading end side in the projecting direction (Y direction) when seen in the thickness direction (Z direction) of the channel 7. However, this does not limit the form of the projection channel layer 7b. For example, the width (length in the X direction) on the leading end side in the projecting direction (Y direction) of the projection channel layer 7b may be the same as that on the main channel layer 7a side. Preferably, however, the exposed end face 7c of the projection channel layer 7b is a flat surface.

While the above-mentioned embodiment represents a case where the direction of magnetization of the first and second ferromagnetic layers 12A, 12B lies in the X direction, it will be sufficient if the direction of magnetization of the first and second ferromagnetic layers 12A, 12B is perpendicular to the projecting direction (Y direction) of the projection channel layer 7b. When the external magnetic field B is applied to the channel 7, the direction of spins within the channel 7 rotates about the axis (Y axis) of the applied magnetic field B as mentioned above. If the direction of magnetization of the first and second ferromagnetic layers 12A, 12B is parallel to the projecting direction of the projection channel layer 7b, no rotation will occur in the direction of spins upon application of the external magnetic field B regardless of from which ferromagnetic layer the spins are injected, whereby magnetic fluxes will be hard to detect. Such magnetic fluxes can favorably be detected when the first and second ferromagnetic layers 12A, 12B have a direction of magnetization perpendicular to the projecting direction of the projection channel layer 7b.

The direction of magnetization of the first and second ferromagnetic layers 12A, 12B may be identical to the mounting direction (Z direction) of the first and second ferromagnetic layers 12A, 12B with respect to the main channel layer 7a, for example. The direction of magnetization of spins transported through the channel 7 after being injected from the ferromagnetic layers is rotated by the external magnetic field B applied from the end face 7c of the projection channel layer 7b in this case as well. Hence, the above-mentioned magnetic fluxes can be detected favorably.

Preferably, the first and second ferromagnetic layers 12A, 12B have the same direction of magnetization. This makes it easy to pin the magnetization of the first and second ferromagnetic layers 12A, 12B. The direction of magnetization of the first ferromagnetic layer 12A may be different, e.g., opposite, from the direction of magnetization of the second ferromagnetic layer 12B. The output peak in the evaluation of the external magnetic field in this case is opposite in polarity from the output peak in the case where the first and second ferromagnetic layers 12A, 12B have the same direction of magnetization.

Preferably, the direction of magnetization of the first and second ferromagnetic layers 12A, 12B is pinned by antiferromagnetic layers arranged on the first and second ferromagnetic layers 12A, 12B, respectively. When the antiferromagnetic layers are exchange-coupled with the first and second ferromagnetic layers 12A, 12B, unidirectional anisotropy can be imparted to the direction of magnetization of the first and second ferromagnetic layers. This yields the first and second ferromagnetic layers 12A, 12B having a higher coercive force in one direction than when no antiferromagnetic layers are provided.

Preferably, between the first and second ferromagnetic layers 12A, 12B, surfaces of the main channel layer 7a and projection channel layer 7b are covered with an insulating layer. The end face 7c of the projection channel layer 7b is exposed without being covered with the magnetic shield S. In order to inhibit the end face 7c from coming into contact with a magnetic recording medium 20, the end face 7c of the projection channel layer 7b may be formed with a protective insulating film or coated with a lubricant.

Preferably, between the first and second ferromagnetic layers 12A, 12B, surfaces of the main channel layer 7a and projection channel layer 7b are electrically insulated from the magnetic shield S. This can restrain spin flows from flowing out from the main channel layer 7a and projection channel layer 7b to the magnetic shield.

Preferably, as illustrated by dotted lines in FIG. 1, the magnetic sensor further comprises permanent magnets 90 for supplying a bias magnetic field to the main channel layer 7a through the end face 7c of the projection channel layer 7b. In the case where no magnetic field is applied to the channel by using the permanent magnets, an output peak appears when the external magnetic field to be detected is zero. Applying a magnetic field to the channel by using the permanent magnets 90 can shift the output peak position, so as to generate an output peak when the external magnetic field is not zero. While FIG. 1 illustrates a case where the magnetic sensor 1 comprises two permanent magnets 90, the magnetic sensor 1 may comprise at least one permanent magnet 90.

Preferably, the first and second ferromagnetic layers 12A, 12B are made of a metal selected from the group consisting of Cr, Mn, Co, Fe, and Ni; an alloy containing at least one element selected from the group; or a compound containing at least one element selected from the group and at least one element selected from the group consisting of B, C, N, Si, and Ge. These materials are ferromagnetic materials having high spin polarizability and thus can favorably achieve functions as spin injection electrodes or spin reception electrodes.

Preferably, the channel 7 (comprising the main channel layer 7a and projection channel layer 7b) is made of a semiconductor containing at least one of Si, Ge, GaAs, C, and ZnO. Such a semiconductor has a relatively long spin diffusion length and thus allows the channel 7 to store spins favorably therewithin. Since the half width of a peak of the voltage output or resistance output with respect to the external magnetic field is proportional to the inverse of the spin life in the channel 7, the magnetic field sensitivity becomes higher as the spin life is longer. Examples of materials having a long spin life for use in the channel 7 include Si and GaAs, in which Si is preferred in particular. As the spin life in the channel 7 is shorter, magnetic fields can be detected in a wider range, though the magnetic field sensitivity becomes lower.

While an example in which a tunnel barrier constituted by an insulating film is employed as a barrier disposed between the main channel layer 7a and at least one of the first and second ferromagnetic layers 12A, 12B is illustrated, the barrier may be a Schottky barrier as well. Such a Schottky barrier is formed by causing at least one of the first and second ferromagnetic layers 12A, 12B made of a metal to form a Schottky junction with the main channel layer 7a made of a semiconductor. The Schottky barrier may also be formed by causing a metal layer arranged between the main channel layer 7a made of a semiconductor and at least one of the first and second ferromagnetic layers 12A, 12B to form a Schottky junction with the main channel layer 7a.

Between the first and second ferromagnetic layers 12A, 12B, the resistance is also changed by a magnetoresistive effect occurring depending on whether the external magnetic field B is applied or not. Therefore, the external magnetic field B can also be detected by monitoring changes in electric current or voltage from a power supply disposed between the first and second ferromagnetic layers 12A, 12B without providing the first and second reference electrodes 20A, 20B.

Figure 5:
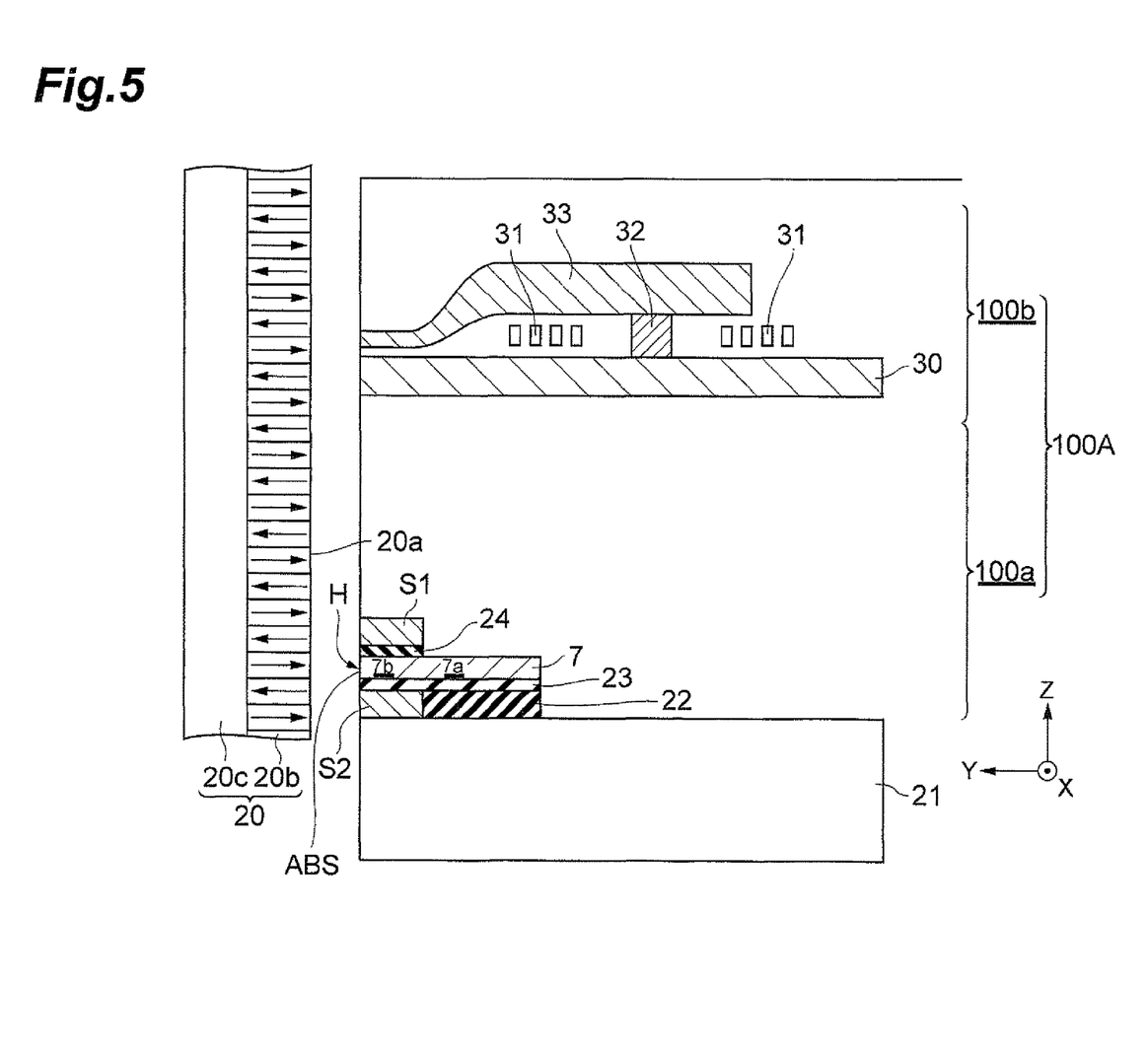
FIG. 5 is a schematic diagram illustrating a thin-film magnetic recording and reproducing head equipped with the magnetic sensor.

FIG. 5 is a schematic diagram illustrating a thin-film magnetic recording and reproducing head (magnetic head) 100A. The above-mentioned magnetic sensor 1 can be employed for a reading head unit 100a of the thin-film magnetic recording and reproducing head 100A. Specifically, the thin-film magnetic recording and reproducing head 100A acts to record and read magnetic information at such a position that its air bearing surface ABS opposes a recording surface 20a of the magnetic recording medium 20. The end face 7c of the projection channel layer 7b exposed from the through hole H in the magnetic sensor 1 is arranged so as to correspond to the air bearing surface ABS.

The magnetic recording medium 20 includes a recording layer 20b having the recording surface 20a and a soft magnetic backing layer 20c mounted on the recording layer 20b and progresses relative to the thin-film magnetic recording and reproducing head 100A in the Z direction in FIG. 5. The thin-film magnetic recording and reproducing head 100A is equipped with a recording head unit 100b for recording to the magnetic recording medium 20 in addition to the reading head unit 100a for reading records from the magnetic recording medium 20. The reading head unit 100a and recording head unit 100b are disposed on the substrate 21 and covered with a nonmagnetic insulating layer such as alumina.

As illustrated in FIG. 5, the recording head unit 100b for writing is disposed on the reading head unit 100a. In the recording head unit 100b, a contact part 32 and a main magnetic pole 33 are disposed on a return yoke 30 and form a magnetic flux path. A thin-film coil 31 is provided so as to surround the contact part 32. When a recording current is caused to flow through the thin-film coil 31, a magnetic flux is released from the leading end of the main magnetic pole 33, whereby information can be recorded in the recording layer 20b of the magnetic recording medium 20 such as a hard disk. As in the foregoing, the thin-film magnetic recording and reproducing head 100A capable of detecting magnetic fluxes from minute areas of magnetic recording media and the like can be provided by using the magnetic sensor 1.

For example, a graphene layer 70a can be used as the channel 7. The graphene layer 70a is a layer in which spins accumulate as being injected therein. Graphene is a sheet having a structure in which carbon atoms are two-dimensionally combined together into a hexagonal net. The graphene layer 70a may be one in which a plurality of graphene sheets are layered, preferably constituted by three or less graphene sheets, more preferably two or less graphene sheets, most preferably a single graphene sheet. This can reduce the thickness of the graphene layer 70a to the limit, whereby magnetic fluxes from very small areas can selectively be detected.

Figure 6A:
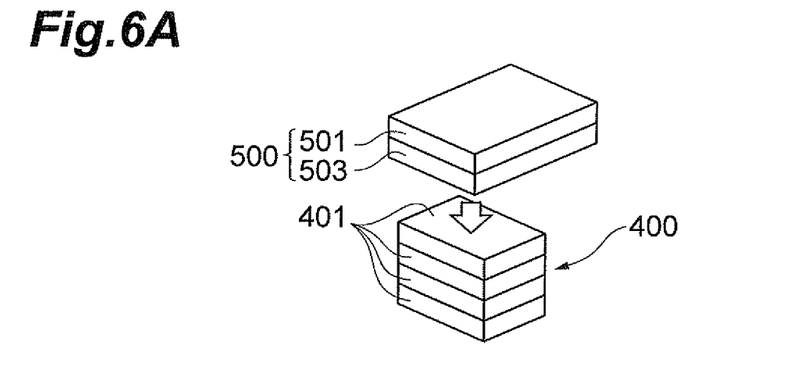
FIGS. 6A, 6B, and 6C are schematic perspective views sequentially illustrating a method for obtaining a desired number of graphene layers by peeling.

Thus constructed graphene layer 70a can be obtained by peeling or decomposition, for example. First, in a peeling method, highly oriented pyrolytic graphite (HOPG) 400 is prepared as illustrated in FIG. 6A, for example. This highly oriented pyrolytic graphite (HOPG) 400 is one in which a number of single-layer graphene sheets 401 are layered. On the other hand, a peeling sheet 500 in which a resist layer 503 is applied onto a film base 501 which is soluble in an organic solvent is prepared.

Figure 6B:
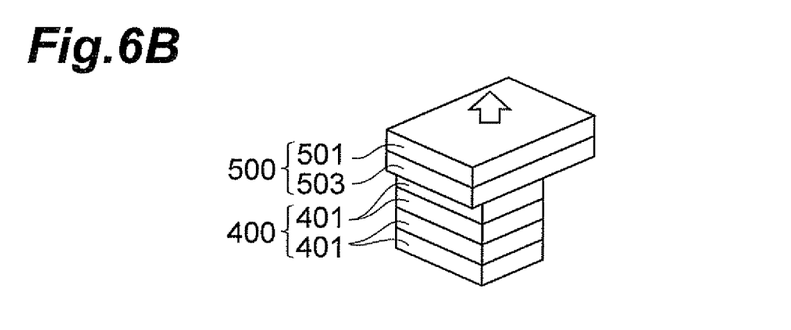
Figure 6C:
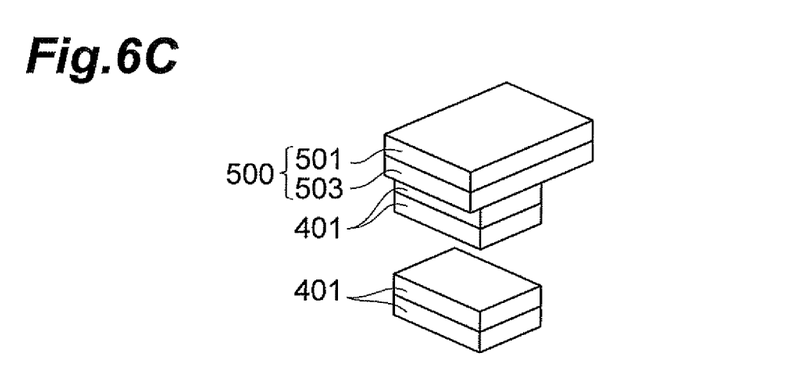

Next, as illustrated in FIG. 6B, the resist layer 503 on the film base 501 is brought into contact with the HOPG 400 under normal pressure. This makes the resist layer 50 and HOPG 400 adhere to each other. Subsequently, the HOPG 400 and peeling sheet 500 are placed in a vacuum, and the peeling sheet 500 is peeled off from the HOPG 400 as illustrated in FIG. 6C. This causes a part, i.e., one or a plurality of layers, of the original HOPG 400 to peel off therefrom and adhere onto the resist layer 503 of the peeling sheet 500.

Figure 7A:
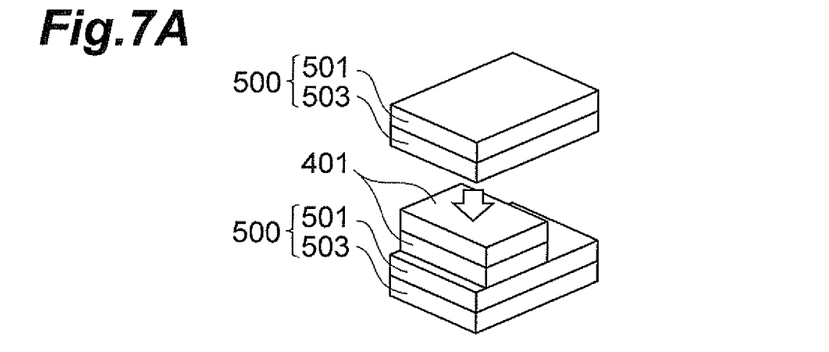
FIGS. 7A, 7B, 7C, and 7D are schematic perspective views sequentially illustrating, subsequently to FIGS. 6A to 6C, the method for obtaining the desired number of graphene layers by peeling.
Figure 7B:
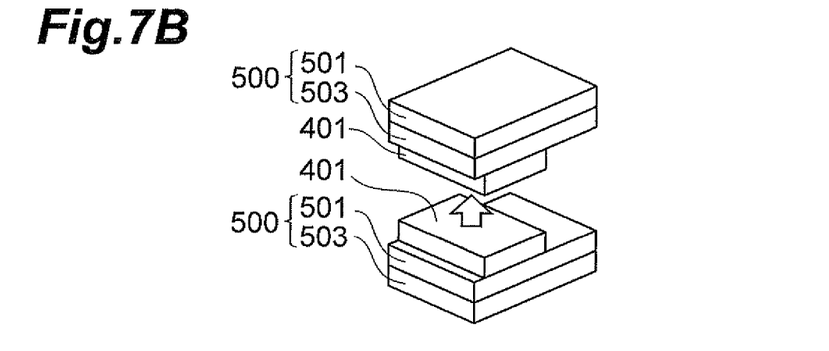

Further, as illustrated in FIG. 7A, another peeling sheet 500 is prepared and, while the vacuum is maintained, its resist is brought into contact with the peeled assembly of a plurality of layered graphene sheets 401 and then peeled off as illustrated in FIG. 7B. Such adhering and peeling operations are repeated in the vacuum so that the attached resist layer attains a desirable thickness under observation with an optical microscope or the like.

Figure 7C:
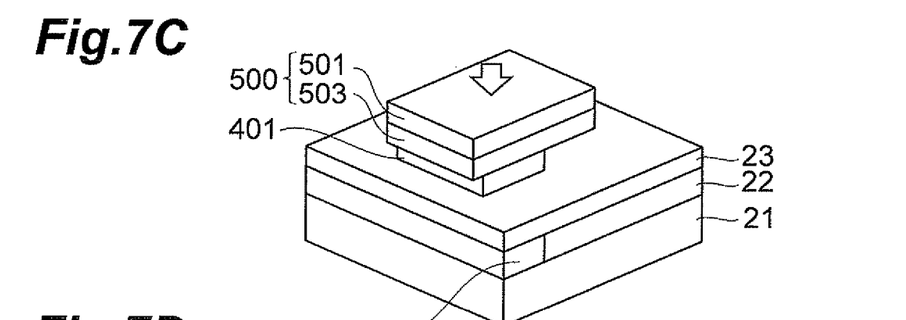
Figure 7D:
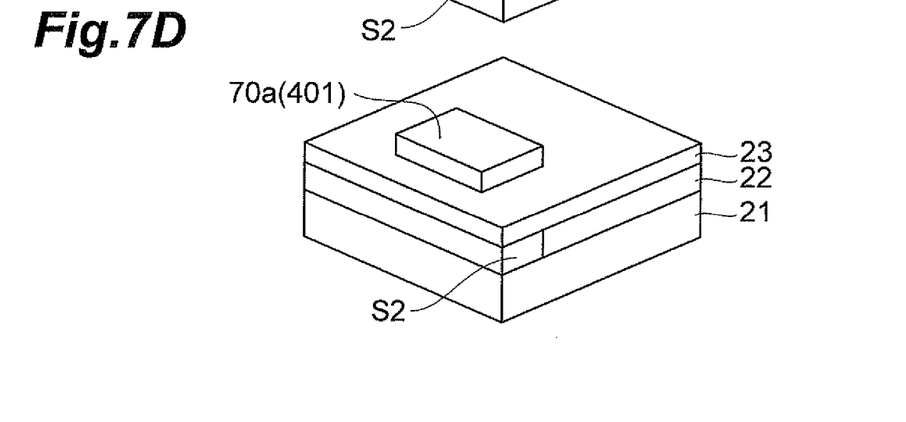

Thereafter, as illustrated in FIG. 7C, the graphene sheet 401 bonded onto the resist layer 503 of the peeling sheet 500 is attached in the vacuum to a base, e.g., onto the intermediate insulating layer 23 of a base in which the lower insulating layer 22, intermediate insulating layer 23, and second magnetic shield layer S2 are mounted on the substrate 21. After normal pressure is resumed, the film base 501 is dissolved with the organic solvent, so that the resist is broken and washed away, whereby a desired number of layers of graphene sheets 401 can be transferred from the peeling sheet 500 onto a desirable base as illustrated in FIG. 7D.

In a decomposition method, for example, an SiC layer formed by CVD or the like is subjected to oxidation or hydrogen etching if necessary, and then silicon atoms are desorbed by electron bombardment heating or the like, whereby a graphene sheet can be formed on the SiC layer.

While an example in which the main channel layer 7a extends along a line in the first direction between the first and second ferromagnetic layers 12A, 12B as illustrated in FIG. 4A is represented, the form of the channel 7 is not limited thereto. The main channel layer 7a may also be shaped like any of letters V and U and arcs, for example, between the first and second ferromagnetic layers 12A, 12B when seen in the mounting direction (Z direction).

What is claimed is:

1. A magnetic sensor comprising:
   a main channel layer having first, second, and third regions and extending in a first direction;
   a first ferromagnetic layer mounted on the first region;
   a second ferromagnetic layer mounted on the second region;
   a projection channel layer projecting in a direction perpendicular to a thickness direction of the main channel layer from a side face of the third region between the first and second regions in the main channel layer; and
   a magnetic shield covering both sides in the thickness direction of the projection channel layer and both sides in the first direction of the projection channel layer and exposing an end face in the projecting direction of the projection channel layer.

2. A magnetic sensor according to claim 1, wherein the first and second ferromagnetic layers have a direction of magnetization perpendicular to the projecting direction of the projection channel layer.

3. A magnetic sensor according to claim 1, wherein the first and second ferromagnetic layers have the same direction of magnetization.

4. A magnetic sensor according to claim 3, wherein the direction of magnetization of the first and second ferromagnetic layers is pinned by antiferromagnetic layers arranged on the first and second ferromagnetic layers, respectively.

5. A magnetic sensor according to claim 1, wherein the first and second ferromagnetic layers have a direction of magnetization in the first direction.

6. A magnetic sensor according to claim 1, wherein the first and second ferromagnetic layers have a direction of magnetization identical to a direction of mounting the first and second ferromagnetic layers with respect to the main channel layer.

7. A magnetic sensor according to claim 1, wherein the end face in the projecting direction of the projection channel has one of rectangular, triangular, trapezoidal, and circular forms.

8. A magnetic sensor according to claim 1, wherein a side face of the main channel layer on a side opposite from the projection channel layer is depressed.

9. A magnetic sensor according to claim 1, wherein, between the first and second ferromagnetic layers, surfaces of the main and projection channel layers are covered with an insulating layer.

10. A magnetic sensor according to claim 1, wherein, between the first and second ferromagnetic layers, the main and projection channel layers are electrically insulated from the magnetic shield.

11. A magnetic sensor according to claim 1, further comprising a permanent magnet for supplying a magnetic field to the main channel layer through the end face of the projection channel layer.

12. A magnetic sensor according to claim 1, wherein the first and second ferromagnetic layers are made of a metal selected from the group consisting of Cr, Mn, Co, Fe, and Ni; an alloy containing at least one element selected from the group; or a compound containing at least one element selected from the group and at least one element selected from the group consisting of B, C, N, Si, and Ge.

13. A magnetic sensor according to claim 1, wherein the main and projection channel layers are made of a semiconductor containing at least one of Si, Ge, GaAs, C, and ZnO.

14. A magnetic sensor according to claim 1, wherein a barrier is formed between at least one of the first and second ferromagnetic layers and the main channel layer.

15. A magnetic sensor according to claim 14, wherein the barrier is a tunnel barrier made of an insulating film.

16. A magnetic sensor according to claim 14, wherein the barrier is a Schottky barrier.

17. A magnetic head comprising:
- a reading head unit constituted by the magnetic sensor according to claim 1; and
- a recording head unit for writing disposed on the reading head unit.

* * * * *